(12) United States Patent
Yang et al.

(10) Patent No.: US 9,560,754 B2
(45) Date of Patent: Jan. 31, 2017

(54) SOLUTION PROCESSED NANOPARTICLE-NANOWIRE COMPOSITE FILM AS A TRANSPARENT CONDUCTOR FOR OPTO-ELECTRONIC DEVICES

(71) Applicant: The Regents of the University of California, Oakland, CA (US)

(72) Inventors: Yang Yang, Los Angeles, CA (US); Choong-Heui Chung, Los Angeles, CA (US); Rui Zhu, Boulder, CO (US); Tze-Bin Song, Los Angeles, CA (US)

(73) Assignee: THE JOHNS HOPKINS UNIVERSITY, Baltimore, MD (US)

( * ) Notice: Subject to any disclaimer, the term of this patent is extended or adjusted under 35 U.S.C. 154(b) by 262 days.

(21) Appl. No.: 14/351,095

(22) PCT Filed: Oct. 15, 2012

(86) PCT No.: PCT/US2012/060276
§ 371 (c)(1),
(2) Date: Apr. 10, 2014

(87) PCT Pub. No.: WO2013/056242
PCT Pub. Date: Apr. 18, 2013

(65) Prior Publication Data
US 2014/0290987 A1 Oct. 2, 2014

Related U.S. Application Data

(60) Provisional application No. 61/546,659, filed on Oct. 13, 2011.

(51) Int. Cl.
*H05K 1/00* (2006.01)
*H05K 1/09* (2006.01)
(Continued)

(52) U.S. Cl.
CPC ............... *H05K 1/09* (2013.01); *G06F 3/042* (2013.01); *H01L 31/022466* (2013.01);
(Continued)

(58) Field of Classification Search
CPC ... B82Y 10/00; C01B 31/022; C01B 31/0293; C08L 1/284; C09J 101/284; H01B 1/00; H01B 1/22; H01B 1/18; H01B 5/00; H01B 5/14; H01L 27/101; H01L 31/1884; H01L 31/022466; H01L 2251/5338; H01L 2924/0002; H01L 51/5206; H01L 51/5215; H01L 51/444; H05B 33/28; H05K 1/09; H05K 3/10; G02F 1/13439; G02F 2203/01; G02F 2202/36; G06F 3/042; G11C 13/00; G11C 13/0023; G11C 13/0033; G11C 2213/79; G11C 2213/71; G11C 2213/81; Y02E 10/50; Y02E 10/549; Y02P 70/521; Y10T 29/49155; Y10T 428/30; Y10T 428/25; Y10T 428/24372; Y10T 428/31678; Y10T 428/24355; Y10S 977/762
(Continued)

(56) References Cited

U.S. PATENT DOCUMENTS 8,436,522 B2 * 5/2013 Cai .................... H01B 1/24
313/309
2005/0126440 A1 * 6/2005 Baldi .................... B82Y 30/00
106/401
(Continued)

FOREIGN PATENT DOCUMENTS

JP 2009-094033 A 4/2009
JP 2009094033 A * 4/2009
(Continued)

OTHER PUBLICATIONS

Elect and Therm Conduct of Cast Al2O3 Metal Matrix Nano_pp. 1-8_Sep. 2011.*
(Continued)

| | | SOLUTION PROCESSED ITO NP |
|---|---|---|
| SPUTTERED ITO | SOLUTION PROCESSED ITO NP | SOLUTION PROCESSED AgNW |
| SPUTTERED i-ZnO | SOLUTION PROCESSED AgNW | SOLUTION PROCESSED ITO NP |
| CdS | CdS | CdS |
| CuIn(Se,S)$_2$ | CuIn(Se,S)$_2$ | CuIn(Se,S)$_2$ |
| Mo-COATED GLASS | Mo-COATED GLASS | Mo-COATED GLASS |

Primary Examiner — Timothy Thompson
Assistant Examiner — Guillermo Egoavil
(74) Attorney, Agent, or Firm — Venable LLP; Henry J. Daley

(57) ABSTRACT

An electro-optic device includes a substructure, a layer of nanowires deposited on the substructure so as to form a network of nanowires having electrically connected junctions at overlapping nanowire portions and defining spaces void of the nanowires, and a plurality of electrically conducting and optically transparent nanoparticles disposed to at least partially fill a plurality of the spaces to provide additional electrically conducting pathways for the network of nanowires across the spaces. The network of nanowires and the plurality of electrically conducting and optically transparent nanoparticles form at least a portion of an optically transparent electrode of the electro-optic device.

32 Claims, 5 Drawing Sheets

(51) Int. Cl.
    *H01L 31/0224*     (2006.01)
    *H01L 31/18*     (2006.01)
    *G06F 3/042*     (2006.01)
    *H05K 3/10*     (2006.01)
    *B82Y 30/00*     (2011.01)
    *G02F 1/1343*     (2006.01)

(52) U.S. Cl.
    CPC ........... *H01L 31/1884* (2013.01); *H05K 3/10* (2013.01); *B82Y 30/00* (2013.01); *G02F 1/13439* (2013.01); *G02F 2202/36* (2013.01); *G02F 2203/01* (2013.01); *Y02E 10/50* (2013.01); *Y10T 29/49155* (2015.01)

(58) Field of Classification Search
    USPC .............. 29/846; 174/253; 257/776, E23.01; 313/352; 428/143, 220, 323; 427/122; 445/46; 977/745, 742
See application file for complete search history.

(56) References Cited

U.S. PATENT DOCUMENTS

| | | | |
|---|---|---|---|
| 2008/0142970 A1* | 6/2008 | Evans | B81C 1/00111 257/741 |
| 2008/0237886 A1* | 10/2008 | Wu | B82Y 10/00 257/776 |
| 2010/0047522 A1* | 2/2010 | Sivarajan | H01B 1/18 428/143 |
| 2011/0018424 A1* | 1/2011 | Takada | H01L 31/022466 313/352 |
| 2011/0094573 A1* | 4/2011 | Wu | H01L 31/022466 136/255 |
| 2012/0234581 A1* | 9/2012 | Ivanov | H01B 1/24 174/255 |

FOREIGN PATENT DOCUMENTS

| | | | | |
|---|---|---|---|---|
| KR | 10-0883737 B1 | 2/2009 | | |
| KR | 10-2009-0103250 A | 10/2009 | | |
| KR | 10-2010-0017128 A | 2/2010 | | |
| KR | WO 2011005013 A3 * | 4/2011 | ..... | H01L 31/035281 |

OTHER PUBLICATIONS

Resistance of Cu Nanowires and Comparison with Carbon Nanotube Bundles_Zhou et al._2008 pp. 1-5.*
Metal Decorated Multi-Walled Carbon NanotubePolyimide—Elliot et al. 2009 pp. 1-24.*
De et al., *ACS Nano* 2009, 3, 1767.
Gordon R. G. *MRS bulletin* 2000, 25, 52.
Hoel et al., *Chem. Mater.* 2010, 22, 3569.
Repins et al., Prog. Photovolt. Res. Appi. 2008, 16, 235.
International Search Report and Written Opinion issued in International Application No. PCT/US2012/060276 dated Mar. 29, 2013.

* cited by examiner

| SPUTTERED ITO |
|---|
| SPUTTERED i-ZnO |
| CdS |
| CuIn(Se,S)$_2$ |
| Mo-COATED GLASS |

| SOLUTION PROCESSED ITO NP |
|---|
| SOLUTION PROCESSED AgNW |
| CdS |
| CuIn(Se,S)$_2$ |
| Mo-COATED GLASS |

| SOLUTION PROCESSED ITO NP |
|---|
| SOLUTION PROCESSED AgNW |
| SOLUTION PROCESSED ITO NP |
| CdS |
| CuIn(Se,S)$_2$ |
| Mo-COATED GLASS |

FIG. 3

SOLUTION PROCESSED NANOPARTICLE-NANOWIRE COMPOSITE FILM AS A TRANSPARENT CONDUCTOR FOR OPTO-ELECTRONIC DEVICES

CROSS-REFERENCE OF RELATED APPLICATION

This is a national stage application under 35 U.S.C. §371 of PCT/US2012/060276 filed Oct. 15, 2012, the entire contents of which are incorporated herein by reference and this application claims priority to U.S. Provisional Application No. 61/546,659 filed Oct. 13, 2011, the entire contents of which are hereby incorporated by reference.

BACKGROUND

1. Field of Invention

The field of the currently claimed embodiments of this invention relates to opto-electronic devices and methods of production, and more particularly to opto-electronic devices that have nanoparticle-nanowire composite transparent electrodes and methods of production.

2. Discussion of Related Art

The most dominant transparent conductive film currently in use for electro-optic devices, such as liquid crystal displays, touch-screen displays and photovoltaic cells, for example, is Indium-Tin-Oxide (ITO). (The terms electro-optic and opto-electronic will be used interchangeably.) High transparency and low sheet resistant have ensured its wide application in many areas. Although it has been used for several decades, there is significant interest in developing alternatives to ITO because of the decreasing availability, and accompanying increase in price, of indium. Due to the high and increasing demand for transparent electrodes, and the limited supply of indium, there is currently an urgent need for new transparent electrodes.

There are several candidates for transparent electrodes based on materials that can potentially replace ITO. These include the use of carbon nanotubes (CNT), graphene, or thin metal films, for example. However, these candidates all have disadvantages that they compromise between optical transparency and electrical conductivity.

Recently, some efforts have been directed to using silver nanowire (AgNW) networks to form transparent conductors. There are several issues that remain to be addressed for the large scale fabrication of AgNW films. First, a good electrical connection between crossed AgNWs is a key factor to achieve high conductivity. However, due to surfactant coating of PVP on the surface of AgNW, extra processes are often utilized to fuse the crossed AgNWs together. These processes include high temperature thermal annealing (>150° C.), applying extra pressure or vacuum filtering on anodized aluminum oxide (AAO) membrane substrates and HCl vapor treatment, etc. Second, strong adhesion between AgNW and substrates is necessary to obtain stable and robust AgNW fibrous films. Substrate surface modification has been used to improve the adhesion of AgNWs on the substrate. Burying AgNW into polymer films by applying pressure can also provide strong adhesion between AgNWs and substrates. Moreover, nail polish or in-situ polymerization has also been reported to improve the adhesion. However, these efforts have not provided transparent electrodes and methods of production that are adequate to replace ITO.

Therefore, there remains a need for improved transparent electrodes, methods of producing the electrodes, and devices that use the electrodes.

SUMMARY

An electro-optic device according to some embodiments of the current invention includes a substructure, a layer of nanowires deposited on the substructure so as to form a network of nanowires having electrically connected junctions at overlapping nanowire portions and defining spaces void of the nanowires, and a plurality of electrically conducting and optically transparent nanoparticles disposed to at least partially fill a plurality of the spaces to provide additional electrically conducting pathways for the network of nanowires across the spaces. The network of nanowires and the plurality of electrically conducting and optically transparent nanoparticles form at least a portion of an optically transparent electrode of the electro-optic device.

A method of producing an electro-optic device according to some embodiments of the current invention includes providing a substructure, depositing a layer of nanowires on the substructure so as to form a network of nanowires having electrically connected junctions at overlapping nanowire portions and defining spaces void of the nanowires, and depositing a plurality of electrically conducting and optically transparent nanoparticles on the substructure and the layer of nanowires to at least partially fill a plurality of the spaces to provide additional electrically conducting pathways for the network of nanowires across the spaces. The network of nanowires and the plurality of electrically conducting and optically transparent nanoparticles form at least a portion of an optically transparent electrode of the electro-optic device.

A method of producing an electro-optic device according to some embodiments of the current invention includes providing a substructure, depositing a plurality of electrically conducting and optically transparent nanoparticles on the substructure, and depositing a layer of nanowires on the plurality of electrically conducting and optically transparent nanoparticles so as to form a network of nanowires having electrically connected junctions at overlapping nanowire portions and defining spaces void of the nanowires. At least some of said plurality of electrically conducting and optically transparent nanoparticles at least partially fill a plurality of the spaces to provide additional electrically conducting pathways for the network of nanowires across the spaces. The network of nanowires and the plurality of electrically conducting and optically transparent nanoparticles form at least a portion of an optically transparent electrode of the electro-optic device.

BRIEF DESCRIPTION OF THE DRAWINGS

Further objectives and advantages will become apparent from a consideration of the description, drawings, and examples.

FIG. 3 shows device schematics for a conventional CuIn(Se,S)$_2$ device (left), one with AgNW/ITO NP transparent conductor according to an embodiment of the current invention (middle), and one with ITO NP/AgNW/ITO NP transparent conductor according to an embodiment of the current invention (right).

DETAILED DESCRIPTION

Some embodiments of the current invention are discussed in detail below. In describing embodiments, specific terminology is employed for the sake of clarity. However, the invention is not intended to be limited to the specific terminology so selected. A person skilled in the relevant art will recognize that other equivalent components can be employed and other methods developed without departing from the broad concepts of the current invention. All references cited anywhere in this specification, including the Background and Detailed Description sections, are incorporated by reference as if each had been individually incorporated.

The term "optically transparent" means that a sufficient amount of light within the wavelength range of operation can pass through for the particular application.

The term "light" is intended to have a broad meaning to include both visible and non-visible regions of the electromagnetic spectrum. For example, infrared and ultraviolet light are intended to be included within the broad definition of the term "light"

The term "nanowire" is intended to include any electrically conducting structure that has cross dimensions less than about 200 nm and a longitudinal dimension that is at least ten times greater than the largest cross dimension. In some cases, the longitudinal dimension can be one hundred times greater than the largest cross dimension, one thousand times greater than the largest cross dimension, or even more.

The term "nanoparticle" is intended to include any shape that has all outer dimensions less than about 200 nm.

The term "network of nanowires" is intended to refer to an arrangement of a plurality of nanowires such that there are multiple overlapping junctions between different nanowires. The nanowires within the network can be randomly or semi-randomly arranged, and can have a distribution of lengths, i.e., they do not have to be uniformly the same length. The network can be thought of as being similar to a fabric, although not woven or tied together in a systematic manner. As an electrode, the plurality of nanowires in the network provide multiple electrical pathways from one edge of the network to the other such that breaking a relatively small number of junctions will still leave alternative electrical paths from one edge of the network to the other. The network of nanowires can thus be flexible as well as fault tolerant, somewhat analogous to a communications network, such as the internet.

The term "solution" is intended to have a broad meaning to include both components dissolved in a liquid as well as components suspended in a liquid. For example, nanoparticles and/or nanowires suspended in a liquid are considered to be within the definition of the term "solution" as used herein.

Figure 1:
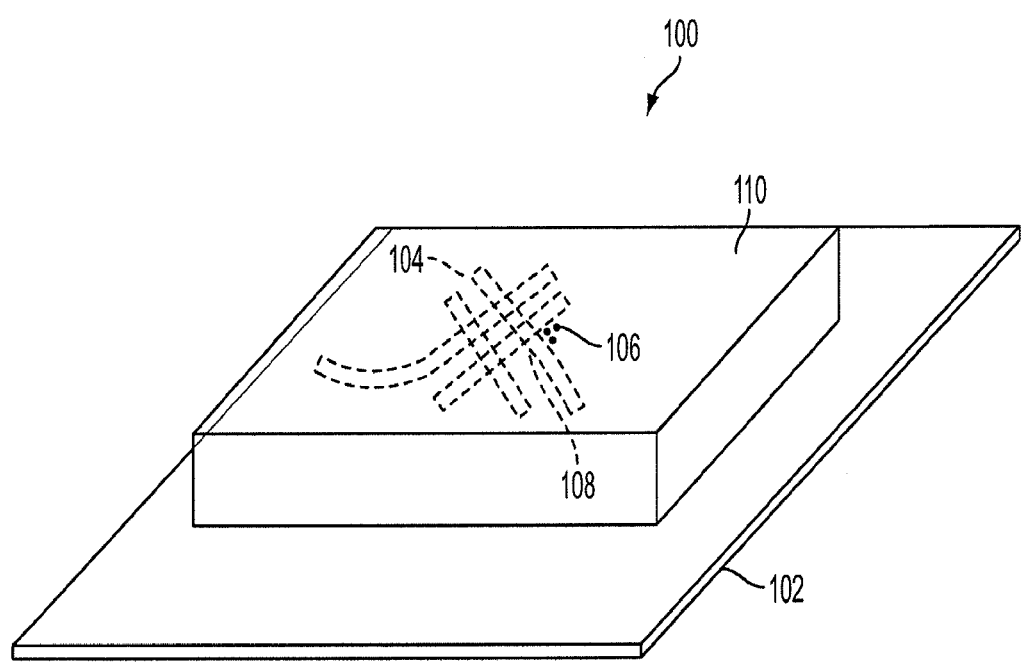
FIG. 1 is a schematic illustration of an electro-optic device according to an embodiment of the current invention.

FIG. 1 is a schematic illustration of an electro-optic device 100 according to another embodiment of the current invention. The electro-optic device 100 includes a substructure 102, a layer of nanowires 104 deposited on the substructure 102 so as to form a network of nanowires having electrically connected junctions at overlapping nanowire portions and defining spaces void of said nanowires deposited on the substructure 102, and a plurality of electrically conducting and optically transparent nanoparticles 106 disposed to at least partially fill a plurality of said spaces to provide additional electrically conducting pathways for the network of nanowires across the spaces attached to the network of nanowires 104. FIG. 1 only illustrates a few nanowires 104 and a few of the plurality of nanoparticles 106, as an example. In some embodiments, the plurality of nanoparticles fuse junctions of overlapping nanowires, such as junction 108, together to reduce electrical sheet resistance of the network of nanowires. The layer of nanowires 104 and the plurality of electrically conducting and optically transparent nanoparticles 106 form at least a portion of an optically transparent electrode of the electro-optic device 100.

In some embodiments, the plurality of electrically conducting and optically transparent nanoparticles 106 substantially fills the spaces void of the nanowires. In some embodiments, at least some of the plurality of electrically conducting and optically transparent nanoparticles 106 fuse junctions, such as junction 108, of overlapping nanowires together to reduce electrical sheet resistance of the network of nanowires 104.

In some embodiments, the electro-optic device 100 can further include a layer of a binding material 110 on the network of nanowires 104 and on the plurality of nanoparticles 106, and also on the substructure 102 such that the binding material 110 encapsulates the network of nanowires 104 and the plurality of nanoparticles 106 on the substructure 102.

In some embodiments, the substructure 102 can further include a layer of electrically conducting and optically transparent nanoparticles (not show in FIG. 1) and the layer of nanowires 104 are deposited on the layer of electrically conducting and optically transparent nanoparticles of the substructure. The general concepts of the current invention can include multiple layers of electrically conducting and optically transparent nanoparticles and/or nanowires in any combination as long as each layer of nanowires is in contact with at least one layer of electrically conducting and optically transparent nanoparticles.

In some embodiments, the plurality of electrically conducting and optically transparent nanoparticles 106 can include at least one of a metal oxide, a conducting polymer, or fluorine-doped tin oxide. In some embodiments, the plurality of electrically conducting and optically transparent nanoparticles 106 can include at least one metal oxide selected from the group of metal oxides consisting of indium tin oxide, zinc oxide, aluminum zinc oxide, indium zinc oxide, and cerium oxide. In some embodiments, the network of nanowires 104 can include at least one of carbon nanotubes or metal nanowires. In some embodiments, the metal nanowires can include at least one of silver, gold, copper, or aluminum. In some embodiments, the nanowires can be a essentially a pure element, or a doped or metallic alloy, for example. In some embodiments, the network of nanowires 104 can consist essentially of silver nanowires and the plurality of electrically conducting and optically transparent nanoparticles 106 can consist essentially of indium tin oxide nanoparticles. In some embodiments, the substructure 102 can include an active layer such that the electro-optic device is at least one of a photovoltaic device, a light-emitting diode, or a photo diode. However, the general concepts of this invention are not limited to these examples. Any electro-optic (or opto-electronic) device that has an electrically conducting and at least partially optically transparent layer may be included within the general concepts of this invention.

A method of producing an electro-optic device 100 according to an embodiment of the current invention includes providing a substructure 102, depositing a layer of nanowires 104 on the substructure 102 so as to form a network of nanowires having electrically connected junctions at overlapping nanowire portions and defining spaces void of the nanowires 104, and depositing a plurality of electrically conducting and optically transparent nanoparticles 106 on the substructure 102 and the layer of nanowires 104 to at least partially fill a plurality of the spaces to provide additional electrically conducting pathways for the network of nanowires across the spaces. The network of nanowires 104 and the plurality of electrically conducting and optically transparent nanoparticles form at least a portion of an optically transparent electrode of the electro-optic device. The various materials noted above can be used in methods of production according to some embodiments of the current invention.

In some embodiments, the method of producing an electro-optic device can further include depositing a layer of electrically conducting and optically transparent nanoparticles on a portion of the substructure 102 prior to the providing the substructure 102 such that the substructure 102 includes the layer of electrically conducting and optically transparent nanoparticles. In this embodiment, the depositing the layer of nanowires 104 on the substructure 102 is depositing the layer of nanowires on the layer of electrically conducting and optically transparent nanoparticles.

In some embodiments, the method of producing an electro-optic device 100 can further include annealing after at least one of the depositing the layer of nanowires 104 or the depositing the plurality of electrically conducting and optically transparent nanoparticles 106. In some embodiments, the annealing can be performed at a temperature of at least 25° C. and less than 1000° C.

In some embodiments, the method of producing an electro-optic device 100 can further include curing with ultra-violet radiation after at least one of the depositing the layer of nanowires 104 or the depositing the plurality of electrically conducting and optically transparent nanoparticles 106.

EXAMPLES

The following examples help explain some concepts of the current invention. However, the general concepts of the current invention are not limited to the particular examples.

Sputter-deposited indium tin oxide (ITO) or Al-doped zinc oxide are commonly used as transparent conductors for thin film optoelectronic devices such as displays and thin film solar cells because those films provide both low resistance and high transmittance (Hoel C. A; Mason T. O., Gaillard J.-F.; Poeppelmeier K. R. *Chem. Mater.* 2010, 22, 3569). Due to high manufacturing cost inherent from the use of vacuum techniques in the preparation of conventional transparent conductors, non-vacuum processing methods have been studied to reduce the cost (Gordon R. G. *MRS bulletin* 2000, 25, 52). Although solution processed silver nano-wire (AgNW) has pursued as a potential alternative, these films have shown poor adhesion to adjacent layers (De, S.; Higgins, T. M.; Lyons, P. E.; Doherty, E. M.; Nirmalraj, P. N.; Blau, W. J.; Boland, J. J.; *ACS Nano* 2009, 3, 1767). Therefore, the development of new structures or materials is needed to offer superior adhesion properties as well as opto-electric properties.

According to an embodiment of the current invention, ITO nanoparticle (NP)-AgNW films have been prepared using a solution process and employed as a transparent conductor in a $CuIn(Se,S)_2$ (or CISS) solar cell. Exemplar results demonstrate that the ITO NP-AgNW films show excellent adhesion and opto-electrical properties comparable with those of conventional sputter-deposited ITO. In addition, the ITO NP-AgNW films have been shown to be suitable to CISS solar cell as transparent conductors (or the window layer), and performance for some examples have been even better than sputter-deposited ITO film that is used in conventional CISS devices. To our knowledge, this is the first demonstrated use of ITO NP-AgNW composite film as a transparent conductor.

EXPERIMENTS AND RESULTS

Fabrication of ITO nanoparticle-AgNW composite transparent conductor. Alcohol based AgNW solution was spun cast to form a film on a glass substrate. The ITO NP solution was then spun cast from an alcohol-based dispersion on the AgNW layer. Polyvinyl alcohol dissolved in de-ionized (DI) water was optionally added into the ITO particle solution to improve the adhesion of ITO NP-AgNW film. To further improve the adhesion of the ITO NP-AgNW films to a substrate, ITO NP film was optionally inserted between a substrate and the AgNW layer. The ITO NP and AgNW layer films were deposited by spin coating from the alcohol based solutions at spin speed of 2000 rpm and then annealed the deposited films at temperatures of 120° C.

Figure 2:
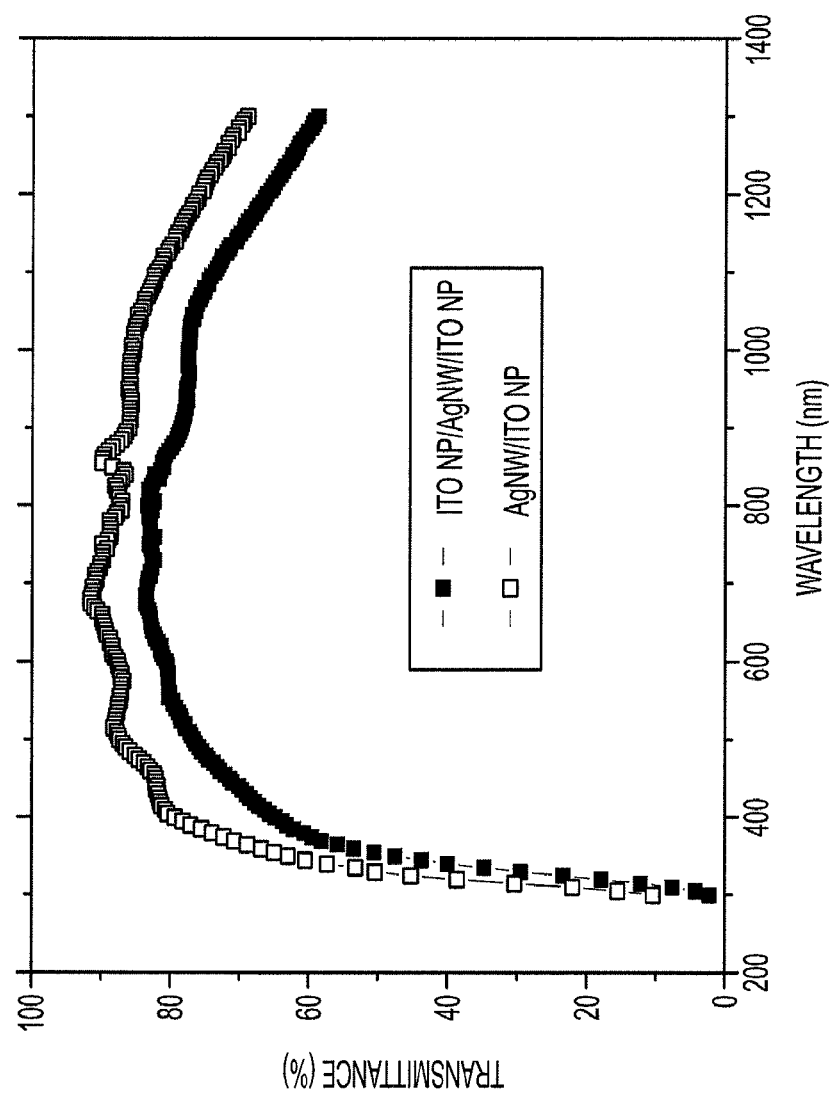
FIG. 2 shows optical transmittance of ITO NP-AgNW composite films with structures of AgNW/ITO NP and ITO NP/AgNW/ITO NP deposited on glass according to embodiments of the current invention.

Electrical and optical properties of the ITO-AgNW composite films. FIG. 2 shows the transmittance of ITO NP-AgNW composite films of AgNW/ITO NP and ITO NP/AgNW/ITO NP deposited on glass. The films have sheet resistances of 32Ω/□ and 24Ω/□, respectively. Both films have transmittance of about 80-90% in the visible region.

$CuIn(Se,S)_2$ device with ITO NP-AgNW composite film as a transparent conductor. Our CISS devices were fabricated according to the typical high efficiency structures reported in the literature (Repins I.; Contreras M. A.; Egaas B.; DeHart C.; Scharf J.; Perkins C. L.; To C.; Noufi R. *Prog. Photovolt. Res. Appl.* 2008, 16, 235). The control device architecture is based on a soda lime glass substrate upon which layers of $CuInSe_2$, cadmium sulfide, sputtered intrinsic-zinc oxide, and sputter-deposited ITO film are subsequently deposited. In our devices according to an embodiment of the current invention, the sputter-deposited i-ZnO and ITO are replaced by a solution-processed ITO NP-AgNW composite film. Each version of the device structure is shown in FIG. 3.

Figure 4:
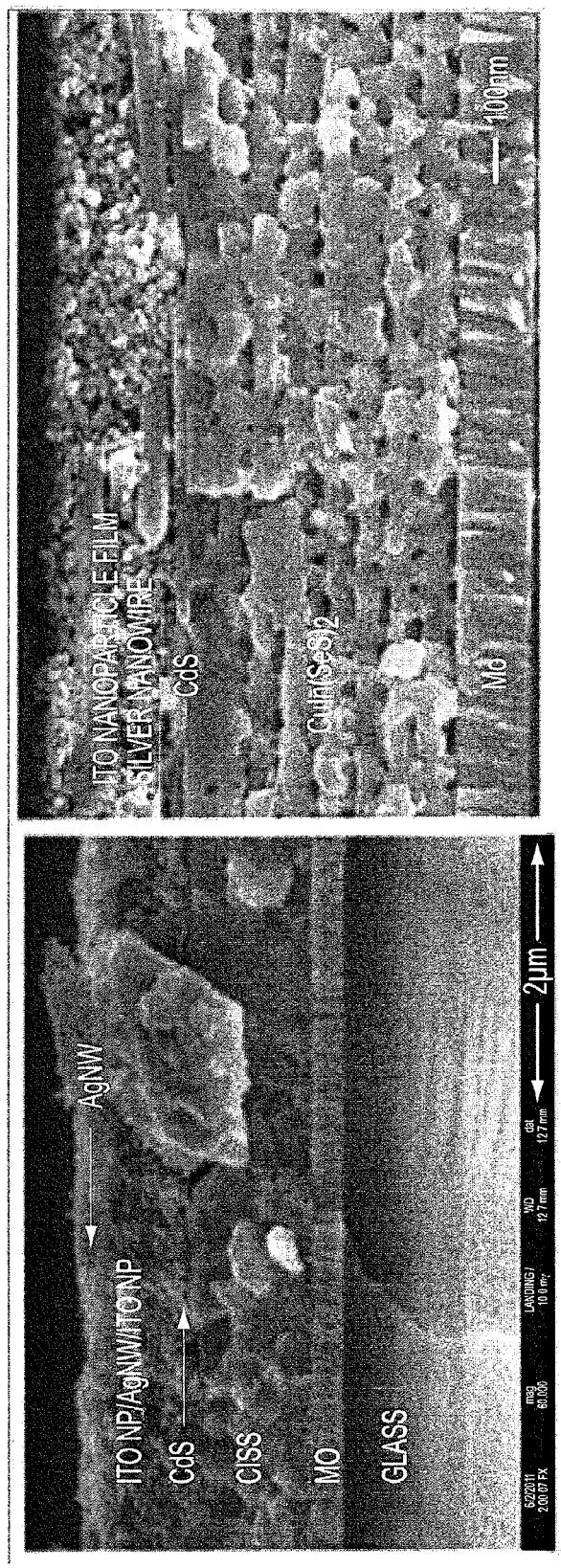
FIG. 4 shows cross-sectional scanning electron microscope image of CISS devices with (left) ITO NP/AgNW/ITO NP and (right) AgNW/ITO NP as transparent conductors according to embodiments of the current invention.

FIG. 4 shows two scanning electron microscope images of CISS devices with ITO NP/AgNW/ITO NP as a transparent conductor. As is visible in the images, the films are continuous across the CdS layer, and are composed of large numbers of compact NPs with a diameter of roughly 50 nm.

Figure 5:
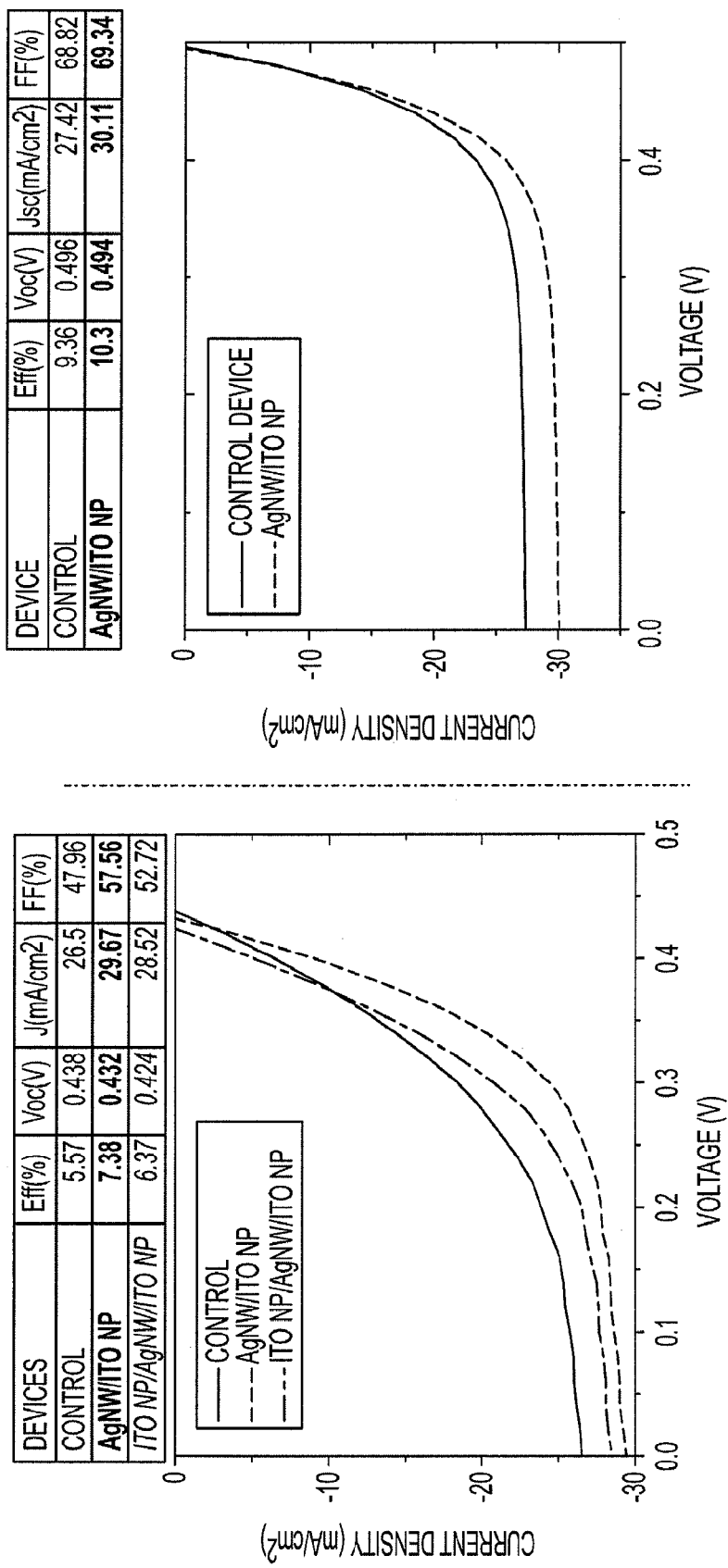
FIG. 5 shows current density-voltage characteristics of the fabricated devices, (left) in batch 1 and (right) batch 2 to compare devices according to some embodiments of the current invention to conventional (control) devices.

Working devices have been fabricated using solution processed ITO NP-AgNW composite layers similar to that pictured in FIG. 2. These devices have shown higher efficiencies than control device with sputter-deoposited i-ZnO/ITO as a transparent conductor layer. FIG. 5 shows the current density-voltage characteristics of a typical device with a solution processed ITO NP-AgNW layers.

Advantages of solution processed ITO NP-AgNW composite layers according to some embodiments of the current invention can come from non-vacuum fabrication production, high-throughput deposition methods, and low processing temperatures, for example. Compared to typical window layers deposited via sputtering or chemical vapor deposition, solution-processed ITO NP-AgNW films can offer dramatic reductions in processing costs and thus enhanced potential for cost-effective device production without sacrificing adhesion and electro-optical properties of transparent conductors. Specific to $CuInSe_2$ solar cells, the low processing temperatures and benign chemical conditions associated with this type of transparent conductor and deposition technique are extremely useful when attempting to avoid damaging either the absorber material or the thermally unstable cadmium sulfide buffer layer that immediately precedes the window layer within the device.

Some aspects of the current invention, without limitation, can include the following:

1. The use of solution processed ITO NP-AgNW films as a part or all of the transparent conductors and/or metal grid in electro-optic devices such as displays and solar cells, including but not limited to $Cu(In,Ga)(Se,S)_2$, $Cu_2ZnSn(Se,S)_4$, CdTe, silicon solar cells, organic solar cells, organic light-emitting diodes, and inorganic light-emitting diodes.
2. The features of item 1 (above) in which the composite film consists of multi-layer of ITO NP/AgNW/ITO NP.
3. The features of item 1 (above) in which the composite film consists of multi-layer of AgNW/ITO NP.
4. The features of item 1 (above) in which the composite film consists of multi-layer of ITO NP/AgNW.
5. The features of item 1 (above) in which the composite film consists of ITO NP-AgNW network prepared by mixture ITO NP-AgNW solution.
6. The features of item 1 (above) in which the ITO NP-AgNW films are prepared by a variety ways of non-vacuum methods such as spin-coating, doctor blading, rod-coating, slit-coating, and spray coating etc.
7. The features of item 1 (above) in which ITO particle size is between 1 nm and 1000 nm.
8. The features of item 1 (above) in which polymer materials such as polyvinylpyrrolidone, polyvinyl alcohol, polyvinyl acetate and polyvinyl butyral are added into ITO NP solution and/or AgNW solution which are used to form ITO NP-AgNW composite films.
9. The features of item 1 (above) in which the length of AgNW is between 100 nm-1000 um.
10. The features of item 1 (above) in which other metal oxides including but not limited to zinc oxide, aluminum zinc oxide, indium zinc oxide, cerium oxide, and fluorine-doped tin oxide, and conductive polymer including but not limited to PEDOT:PSS are also candidates for the same function as ITO NP.
11. The features of item 1 (above) in which other one dimensional nanostructures including carbon nanotubes and metal nanowires including but not limited to copper, gold and aluminum and/or their alloys nanowires are also candidates for the same function as AgNW.
12. The features of item 1 (above) in which the films are annealed at temperatures between 25-1000° C.
13. The features of item 1 (above) in which the films are cured by UV-radiation.

The embodiments illustrated and discussed in this specification are intended only to teach those skilled in the art how to make and use the invention. In describing embodiments of the invention, specific terminology is employed for the sake of clarity. However, the invention is not intended to be limited to the specific terminology so selected. The above-described embodiments of the invention may be modified or varied, without departing from the invention, as appreciated by those skilled in the art in light of the above teachings. It is therefore to be understood that, within the scope of the claims and their equivalents, the invention may be practiced otherwise than as specifically described.

We claim:

1. An electro-optic device, comprising:
   a substructure;
   a layer of nanowires deposited on said substructure so as to form a network of nanowires having electrically connected junctions at overlapping nanowire portions and defining spaces void of said nanowires; and
   a plurality of electrically conducting and optically transparent nanoparticles disposed to at least partially fill a plurality of said spaces to provide additional electrically conducting pathways for said network of nanowires across said spaces,
   wherein said network of nanowires and said plurality of electrically conducting and optically transparent nanoparticles form at least a portion of an optically transparent electrode of said electro-optic device,
   wherein said substructure further comprises a layer of electrically conducting and optically transparent nanoparticles, and
   wherein said layer of nanowires are deposited on said layer of electrically conducting and optically transparent nanoparticles.

2. An electro-optic device according to claim 1, wherein said plurality of electrically conducting and optically transparent nanoparticles substantially fill said spaces void of said nanowires.

3. An electro-optic device according to claim 1, wherein at least some of said plurality of electrically conducting and optically transparent nanoparticles fuse junctions of overlapping nanowires together to reduce electrical sheet resistance of said network of nanowires.

4. An electro-optic device according to claim 1, further comprising a polymer layer at least one of encapsulating said layer of nanowires and said plurality of electrically conducting and optically transparent nanoparticles or intermixed with at least one of said layer of nanowires and said plurality of electrically conducting and optically transparent nanoparticles to form a composite polymer-nanowire-nanoparticle layer.

5. An electro-optic device according to claim 1, wherein said plurality of electrically conducting and optically transparent nanoparticles comprise at least one of a metal oxide, a conducting polymer, or fluorine-doped tin oxide.

6. An electro-optic device according to claim 5, wherein said plurality of electrically conducting and optically transparent nanoparticles comprise at least one metal oxide selected from the group of metal oxides consisting of indium tin oxide, zinc oxide, aluminum zinc oxide, indium zinc oxide, and cerium oxide.

7. An electro-optic device according to claim 1, wherein said network of nanowires comprise at least one of carbon nanotubes or metal nanowires.

8. An electro-optic device according to claim 7, wherein said metal nanowires comprise at least one of silver, gold, copper, or aluminum.

9. An electro-optic device according to claim 5, wherein said network of nanowires comprise at least one of carbon nanotubes or metal nanowires.

10. An electro-optic device according to claim 9, wherein said metal nanowires comprise at least one of silver, gold, copper, or aluminum.

11. An electro-optic device according to claim 10, wherein said plurality of electrically conducting and optically transparent nanoparticles comprise at least one metal oxide selected from the group of metal oxides consisting of indium tin oxide, zinc oxide, aluminum zinc oxide, indium zinc oxide, and cerium oxide.

12. An electro-optic device according to claim 1, wherein said network of nanowires consist essentially of silver nanowires, and
wherein said plurality of electrically conducting and optically transparent nanoparticles consist essentially of indium tin oxide nanoparticles.

13. An electro-optic device according to claim 1, wherein said substructure comprises an active layer such that said electro-optic device is at least one of a photovoltaic device, a light-emitting diode, or a photo diode.

14. A method of producing an electro-optic device, comprising:
providing a substructure;
depositing a layer of nanowires on said substructure so as to form a network of nanowires having electrically connected junctions at overlapping nanowire portions and defining spaces void of said nanowires;
depositing a plurality of electrically conducting and optically transparent nanoparticles on said substructure and said layer of nanowires to at least partially fill a plurality of said spaces to provide additional electrically conducting pathways for said network of nanowires across said spaces; and
depositing a layer of electrically conducting and optically transparent nanoparticles on a portion of said substructure prior to said providing said substructure such that said substructure comprises said layer of electrically conducting and optically transparent nanoparticles,
wherein said network of nanowires and said plurality of electrically conducting and optically transparent nanoparticles form at least a portion of an optically transparent electrode of said electro-optic device, and
wherein said depositing said layer of nanowires on said substructure is depositing said layer of nanowires on said layer of electrically conducting and optically transparent nanoparticles.

15. A method of producing an electro-optic device according to claim 14, wherein said plurality of electrically conducting and optically transparent nanoparticles substantially fill said spaces void of said nanowires.

16. A method of producing an electro-optic device according to claim 14, wherein at least some of said plurality of electrically conducting and optically transparent nanoparticles fuse junctions of overlapping nanowires together to reduce electrical sheet resistance of said network of nanowires.

17. A method of producing an electro-optic device according to claim 14, further comprising adding a plurality of nanowires to a liquid to form a nanowire solution for solution deposition of said layer of nanowires.

18. A method of producing an electro-optic device according to claim 17, further comprising adding a plurality of electrically conducting and optically transparent nanoparticles to a liquid to form a nanoparticle solution for solution deposition of said plurality of electrically conducting and optically transparent nanoparticles.

19. A method of producing an electro-optic device according to claim 18, further comprising mixing a polymer with at least one of said nanowire solution or said nanoparticle solution to form a composite layer that includes said polymer.

20. A method of producing an electro-optic device according to claim 14, wherein said plurality of electrically conducting and optically transparent nanoparticles comprise at least one of a metal oxide, a conducting polymer, or fluorine-doped tin oxide.

21. A method of producing an electro-optic device according to claim 20, wherein said plurality of electrically conducting and optically transparent nanoparticles comprise at least one metal oxide selected from the group of metal oxides consisting of indium tin oxide, zinc oxide, aluminum zinc oxide, indium zinc oxide, and cerium oxide.

22. A method of producing an electro-optic device according to claim 14, wherein said network of nanowires comprise at least one of carbon nanotubes or metal nanowires.

23. A method of producing an electro-optic device according to claim 22, wherein said metal nanowires comprise at least one of silver, gold, copper, or aluminum.

24. A method of producing an electro-optic device according to claim 20, wherein said network of nanowires comprise at least one of carbon nanotubes or metal nanowires.

25. A method of producing an electro-optic device according to claim 24, wherein said metal nanowires comprise at least one of silver, gold, copper, or aluminum.

26. A method of producing an electro-optic device according to claim 25, wherein said plurality of electrically conducting and optically transparent nanoparticles comprise at least one metal oxide selected from the group of metal oxides consisting of indium tin oxide, zinc oxide, aluminum zinc oxide, indium zinc oxide, and cerium oxide.

27. A method of producing an electro-optic device according to claim 14, wherein said network of nanowires consist essentially of silver nanowires, and
wherein said plurality of electrically conducting and optically transparent nanoparticles consist essentially of indium tin oxide nanoparticles.

28. A method of producing an electro-optic device according to claim 14, wherein said substructure comprises an active layer such that said electro-optic device is at least one of a photovoltaic device, a light-emitting diode, or a photo diode.

29. A method of producing an electro-optic device according to claim 14, further comprising annealing after at least one of said depositing said layer of nanowires or said depositing said plurality of electrically conducting and optically transparent nanoparticles.

30. A method of producing an electro-optic device according to claim 29, wherein said annealing is performed at a temperature of at least 25° C. and less than 1000° C.

31. A method of producing an electro-optic device according to claim 14, further comprising curing with ultra-violet radiation after at least one of said depositing said layer of nanowires or said depositing said plurality of electrically conducting and optically transparent nanoparticles.

32. A method of producing an electro-optic device according to claim 30, further comprising curing with ultra-violet radiation after at least one of said depositing said layer of nanowires or said depositing said plurality of electrically conducting and optically transparent nanoparticles.

* * * * *

UNITED STATES PATENT AND TRADEMARK OFFICE
CERTIFICATE OF CORRECTION

PATENT NO. : 9,560,754 B2  Page 1 of 1
APPLICATION NO. : 14/351095
DATED : January 31, 2017
INVENTOR(S) : Yang Yang et al.

It is certified that error appears in the above-identified patent and that said Letters Patent is hereby corrected as shown below:

On the Title Page

In the Assignee item (73), replace "THE JOHNS HOPKINS UNIVERSITY, Baltimore, MD (US)" with -- THE REGENTS OF THE UNIVERSITY OF CALIFORNIA, Oakland, CA (US) --

Signed and Sealed this
Twenty-sixth Day of September, 2017

Joseph Matal
*Performing the Functions and Duties of the*
*Under Secretary of Commerce for Intellectual Property and*
*Director of the United States Patent and Trademark Office*